US012633901B2

(12) United States Patent
Knapp et al.

(10) Patent No.: US 12,633,901 B2
(45) Date of Patent: May 19, 2026

(54) SURFACE ACOUSTIC WAVE RESONATOR AND MULTIPLEXER INCLUDING THE SAME

(71) Applicant: RF360 Singapore Pte. Ltd., Republic Plaza (SG)

(72) Inventors: Matthias Knapp, Munich (DE); Christian Huck, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 775 days.

(21) Appl. No.: 17/297,934

(22) PCT Filed: Dec. 17, 2019

(86) PCT No.: PCT/EP2019/085657
§ 371 (c)(1),
(2) Date: May 27, 2021

(87) PCT Pub. No.: WO2020/127270
PCT Pub. Date: Jun. 25, 2020

(65) Prior Publication Data
US 2022/0029605 A1 Jan. 27, 2022

(30) Foreign Application Priority Data
Dec. 19, 2018 (DE) ..................... 10 2018 132 862.1

(51) Int. Cl.
| | |
|---|---|
| *H03H 9/25* | (2006.01) |
| *H03H 9/02* | (2006.01) |
(Continued)

(52) U.S. Cl.
CPC .......... *H03H 9/25* (2013.01); *H03H 9/02582* (2013.01); *H03H 9/02834* (2013.01); *H03H 9/6483* (2013.01); *H03H 9/725* (2013.01)

(58) Field of Classification Search
CPC .. H03H 9/02535; H03H 9/02834; H03H 9/25; H03H 9/64; H03H 9/725
See application file for complete search history.

(56) References Cited

U.S. PATENT DOCUMENTS

| | | | | |
|---|---|---|---|---|
| 9,159,900 B2 * | 10/2015 | Tamasaki | ............... | H10N 30/88 |
| 11,394,365 B2 * | 7/2022 | Knapp | ............... | H03H 9/02834 |
(Continued)

FOREIGN PATENT DOCUMENTS

| | | |
|---|---|---|
| CN | 101145767 A | 3/2008 |
| CN | 101145768 A | 3/2008 |
(Continued)

OTHER PUBLICATIONS

International Search Report and Written Opinion—PCT/EP2019/085657—ISA/EPO—Apr. 3, 2020.
(Continued)

*Primary Examiner* — Andrea Lindgren Baltzell
*Assistant Examiner* — Alan Wong
(74) *Attorney, Agent, or Firm* — Polsinelli

(57) ABSTRACT
A surface acoustic wave resonator (100) comprises a layered substrate including a carrier substrate (110) and a dielectric layer (112) having a low acoustic velocity. Another dielectric layer (122) is disposed on a piezoelectric layer (113) and interdigitated electrodes (131, 132) having an acoustic velocity lower than the acoustic velocity of the carrier substrate (110) and a positive temperature coefficient of frequency.

17 Claims, 2 Drawing Sheets

(51) Int. Cl.
   _H03H 9/64_          (2006.01)
   _H03H 9/72_          (2006.01)

(56)                References Cited

U.S. PATENT DOCUMENTS

| | | | |
|---|---|---|---|
| 2013/0285768 A1* | 10/2013 | Watanabe | H03H 9/02834 |
| | | | 333/193 |
| 2014/0203893 A1 | 7/2014 | Kando et al. | |
| 2015/0028720 A1 | 1/2015 | Kando | |
| 2017/0222618 A1 | 8/2017 | Inoue et al. | |
| 2018/0159494 A1 | 6/2018 | Goto et al. | |
| 2018/0159497 A1 | 6/2018 | Iwamoto et al. | |
| 2018/0159507 A1 | 6/2018 | Goto et al. | |
| 2018/0301616 A1 | 10/2018 | Kimura et al. | |

FOREIGN PATENT DOCUMENTS

| | | |
|---|---|---|
| CN | 102089970 A | 6/2011 |
| CN | 103262410 A | 8/2013 |
| CN | 107710614 A | 2/2018 |
| JP | 2008079227 A | 4/2008 |
| JP | WO2010079575 A1 | 6/2012 |
| JP | 2012169760 A | 9/2012 |
| WO | 2018092511 A1 | 5/2018 |

OTHER PUBLICATIONS

Fujii S., et al., "High-Frequency SAW Filters Based on Diamond Films", IEEE, Transactions on Ultrasonics, Ferroelectrics, and Frequency Control, vol. 59, No. 12, Dec. 2012, pp. 2758-2764.

\* cited by examiner

SURFACE ACOUSTIC WAVE RESONATOR AND MULTIPLEXER INCLUDING THE SAME

TECHNICAL FIELD

The present disclosure relates to surface acoustic wave resonators. Specifically, the present disclosure relates to surface acoustic wave resonators that comprise a layered substrate including a carrier substrate and layers disposed thereon having different acoustic velocities. The present disclosure also relates to a RF multiplexer circuit that includes filters with surface acoustic wave resonators.

BACKGROUND

Surface acoustic wave (SAW) resonators are widely used in electronic devices to form electronic filters or other devices having a frequency selective function. Applying an electrical signal to the electrodes disposed on the piezoelectric layer causes a resonating acoustic wave within the piezoelectric substrate that has a frequency selective effect. A RF filter may include several resonators connected in series and shunt paths such as a ladder-type structure. The filter exhibits a passband of low attenuation and a stopband with high attenuation outside the passband. Multiplexer circuits include several signal paths through corresponding filters that are connected to an antenna port and may include receive (Rx) and transmit (Tx) capabilities. A simple structure of a multiplexer is a duplexer circuit that includes a receive and a transmit filter which are coupled to the same antenna port and serve different receive and transmit circuits, respectively.

SAW resonators may include a layered or stacked substrate structure that comprises several layers having different acoustic velocities. A layered substrate structure may include at least a carrier substrate, a dielectric layer of lower acoustic velocity disposed thereon and a piezoelectric layer disposed on the dielectric layer. An electrode structure is disposed on top of the piezoelectric layer. Additional layers may be included in the layer stack.

One inherent characteristic of SAW resonators with layered substrate systems is that resonating and anti-resonating frequencies of the resonator and correspondingly the lower and upper edge of the passband of a filter have a different temperature coefficient of frequency (TCF). In this case, the resonance and anti-resonance frequencies or the lower and upper edges of a filter passband move differently with varying temperature. In a RF filter, the lower edge of the passband moves more slowly when compared to the upper edge which moves faster, most likely to lower frequencies so that the passband of the RF filter may become smaller with increasing temperature. In a duplexer circuit, the inner edges of the adjacent Tx- and Rx-filters become more distant with increasing temperature so that it is difficult to meet the frequency band specifications. This effect becomes more crucial with filters, duplexers and multiplexers for future communication standards that require filters with even higher selectivity and linearity. Accordingly, the TCF of SAW resonators with layered substrate systems should be lower than heretofore.

The layered substrate system usually includes a dielectric layer of low acoustic velocity that usually has a positive TCF. Increasing the thickness of said layer may compensate the negative TCF of the other layers in the substrate system. However, a thick dielectric layer such as a thick silicon dioxide layer within the layered substrate system may lead to the excitation of volume waves in this layer that appear in the stopband region of a filter which may lead to distortion and cross-coupling into other filters. This is especially true for duplexers that are coupled to the same antenna where a volume wave exited in a silicon dioxide layer of the layered substrate of the resonators of one of the filters of the duplexer may couple into the passband of the other one of the filters so that the transmit path may affect the receive path and vice versa. Therefore, improved temperature performance and low temperature coefficient of frequency of a resonator are desired. Furthermore, reduced excitation of unwanted volume waves are desired.

It is an object of the present disclosure to provide a surface acoustic wave resonator that has a low or compensated temperature coefficient of frequency.

It is another object of the present disclosure to provide a RF multiplexer that has a low or compensated temperature coefficient of frequency.

SUMMARY

One or more of the above-mentioned objects are achieved by a surface acoustic wave resonator comprising the features of present claim 1.

A surface acoustic wave resonator according to the principles of the present disclosure comprises a layered substrate or a stack of several layers. The layered substrate includes a carrier substrate that has a relatively high acoustic velocity. A dielectric layer is disposed on the carrier substrate and has a low acoustic velocity that is lower than the acoustic velocity of the carrier substrate. A piezoelectric layer is disposed on the dielectric layer. A pair of interdigitated electrodes is disposed on the piezoelectric layer. By the application of an electrical signal to the interdigitated electrodes, an acoustic wave is generated in the piezoelectric layer and acoustic waves are generated in the different layers of the layered substrate so that a barrier is established that prevents energy from leaking from the piezoelectric layer. Accordingly, SAW resonators with layered substrates have a high electromechanical coupling factor (k2). An optional layer of high acoustic velocity may be disposed between the carrier substrate and the dielectric layer of low acoustic velocity to improve the velocity barrier. One or more additional functional layers may be disposed on the carrier substrate such as a charge trapping layer collecting charges from the interface between the carrier substrate and the low velocity layer.

The dielectric layer in the layered substrate of low acoustic velocity may have a positive temperature coefficient of frequency. This dielectric layer has a temperature compensating effect and compensates the negative TCFs of the carrier substrate and the piezoelectric layer at least to a certain extent.

Another dielectric layer of low acoustic velocity lower than the acoustic velocity of the carrier substrate and of positive TCF is disposed on the electrodes and on the piezoelectric layer. Said layer covers the electrodes and the surface of the piezoelectric layer. Since the top dielectric layer has a positive TCF and a low velocity, it improves temperature compensation within the resonator. The dielectric layer of the layered substrate and the top dielectric layer both contribute to the temperature compensation of the resonator.

Since the temperature compensating function of the resonator is achieved by two dielectric layers, i.e. the top dielectric layer and the dielectric layer of the layered substrate, the latter dielectric layer of the layered substrate system may have a smaller thickness or height than in a conventional approach, since a portion of the temperature compensating function is performed by the top dielectric layer. As a result, the excitation of unwanted volume waves within the dielectric substrate layer is reduced. This is useful for multiplexers that have neighboring Tx and Rx filters because the coupling of additional modes in a neighboring passband is reduced.

The top dielectric layer carries more energy since it is closer to the electrodes than the dielectric layer of the layered substrate. Accordingly, the same temperature compensating effect can be achieved with a top dielectric layer having a lower height than the dielectric layer of the layered substrate. Consequently, the overall height of the resonator according to this disclosure including a top dielectric layer may be reduced when compared to a conventional approach.

According to embodiments, the top dielectric layer may have an acoustic velocity that is lower than the acoustic velocity of any of the layers of the layered substrate system. The carrier substrate and the piezoelectric layer may have a negative TCF which is a TCF below zero, wherein the dielectric layer of the layered substrate system and the top dielectric layer may have a positive TCF that is larger than zero. Specifically, the dielectric layer of the layered substrate and the top dielectric layer may have the same TCF and may be made of the same material.

A skilled person is knowledgeable about dielectric layers that have positive TCF and that fit within the layered substrate and on top of the resonator. According to an embodiment, the dielectric layer of the layered substrate and the top dielectric layer may comprise silicon dioxide or may consist of silicon dioxide (SiO2). Alternatives to SiO2 are germanium dioxide (GeO2), scandium yttrium fluoride (ScYF), zirconium tungsten oxide (ZrW2O8), and hafnium tungsten oxide (HfW2O8). The dielectric layers may comprise said materials or may consist of said materials.

The height of the top dielectric layer may be set in relation to other layers in the resonator. The electrodes have a multitude of interdigitated fingers up to several hundreds of fingers. The pitch or repetitive distance with which the electrode fingers are arranged is related to an operating wavelength of the resonator. The difference between the height of the top dielectric layer and the height of the piezoelectric layer relative to the wavelength should be lower than half or 50%. According to embodiments, the difference between relative height of the top dielectric layer and relative height of the piezoelectric layer should be between 1% and 50%. More practically, the difference of relative heights can be between 5% and 15%. More preferably, the relative difference of heights can be between 7% and 12%. In one embodiment, the difference of relative heights between top dielectric layer and piezoelectric layer is 10% or about 10%. Relative height means the height of the top dielectric layer or the height of the piezoelectric layer divided by the wavelength X given by the pitch of the interdigitated electrodes, for example, about two times the pitch.

The layered substrate may include another layer that has an acoustic velocity that is higher than the acoustic velocity of the carrier substrate. Said additional layer may be disposed between the carrier substrate and the dielectric layer of the layered substrate. The additional layer of high acoustic velocity increases the vertical velocity barrier established by the velocity difference within the layer stack so that the confinement of the acoustic energy within the system is increased.

A passivation layer may be disposed on the top dielectric layer to passivate the top surface from external effects. The passivation layer may be made of silicon nitride or other passivation materials.

In terms of materials, the carrier substrate may comprise monocrystalline silicon, aluminum oxide, silicon carbide or diamond. The dielectric layer may comprise silicon dioxide, germanium dioxide or doped silicon dioxide. The piezoelectric layer may comprise lithium tantalate, lithium niobate, aluminum nitride or quartz. The further layer of high acoustic energy disposed between the carrier substrate and the dielectric layer may comprise a material of high acoustic velocity such as polycrystalline silicon, amorphous silicon, non-piezoelectric aluminum nitride or silicon carbide.

A resonator according to the present disclosure may be preferably used in a RF multiplexer circuit such as a RF duplexer or a higher order multiplexer. The RF multiplexer includes at least an antenna port to which a transmit and a receive filter are coupled. A transmit port is coupled to another end of the transmit filter and a receive port is coupled to another end of the receive filter. The latter ports are configured to be coupled to external circuitry such as a transmit circuit and a receive circuit, respectively. The Tx/Rx filters include temperature compensated SAW resonators so that the different TCF of lower and upper edges of the filters in the multiplexer are substantially temperature compensated and substantially avoid a temperature-induced movement relative to each other. On the other hand, the use of the top dielectric layer for temperature compensation allows to maintain or even reduce the dielectric layer of the layered substrate so that the generation of unwanted modes such as volume modes at higher frequencies are reduced. As a result, the coupling of energy from one of the filters such as the transmit filter into the receive filter of a duplexer is substantially reduced.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF THE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
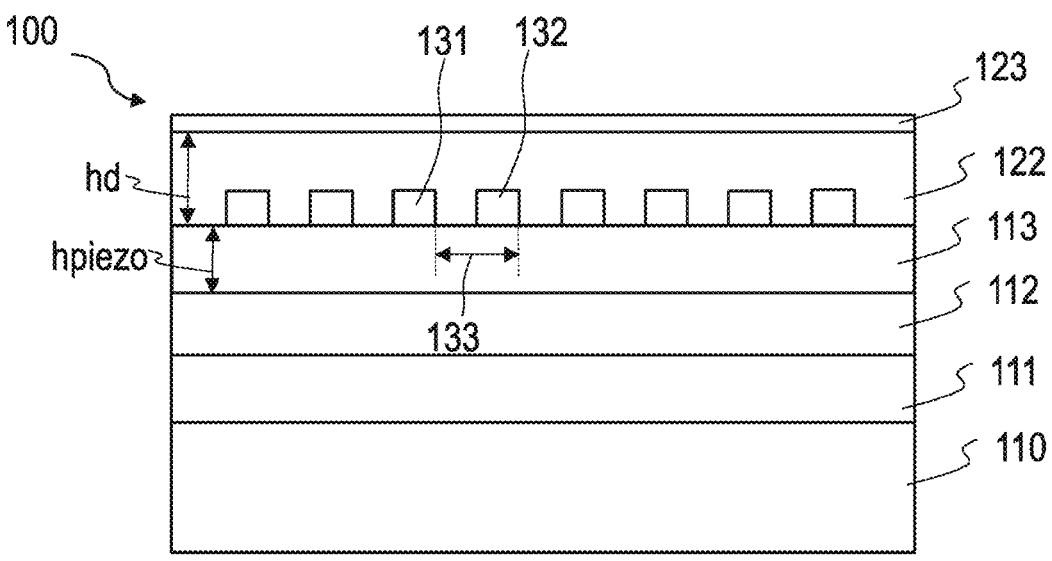
FIG. 1 shows a cross-section of a surface acoustic wave resonator according to the principles of the present disclosure.

FIG. 1 shows a cross-sectional view of a portion of a SAW resonator 100 according to the principles of the present disclosure. The resonator comprises a layered substrate comprising a stack of several layers of different acoustic velocities 110, 111, 112, 113. There is a lowermost carrier substrate no having moderate acoustic velocity. A layer in of high acoustic velocity is disposed on carrier substrate 110. A dielectric layer 112 of low acoustic velocity is disposed on layer in. A piezoelectric layer 113 is disposed on low acoustic velocity layer 112. Layer in of high acoustic velocity is optional and can be omitted. Additional layers may be disposed between carrier substrate 110 and high acoustic velocity layer 111 dedicated to specific functions such as a charge trapping layer or others. The layered or stacked substrate comprises layers of different acoustic velocity which achieves a defined vertical acoustic velocity profile so that the acoustic energy is substantially confined to the upper portion of the layer stack.

Carrier substrate no may comprise or may consist of monocrystalline silicon, aluminum oxide or Saphire, silicon carbide or diamond so that it exhibits moderate acoustic velocity. The optional layer in of high acoustic velocity may be made or may consist of polycrystalline silicon, amorphous silicon, aluminum nitride or silicon carbide. A charge trapping layer may be disposed between layers no and in.

Layer 112 is a dielectric layer that has a relatively low acoustic velocity, which is at least lower than the acoustic velocity of carrier substrate 110. Layer 112 may comprise or may consist of silicon dioxide, germanium dioxide, scandium yttrium fluoride, zirconium tungsten oxide, hafnium tungsten oxide, doped silicon dioxide such as fluorine-doped silicon dioxide. Doped silicon dioxide is very useful and it can be manufactured with standardized processes in a very defined way. The layer 112 has also a temperature compensating effect. While layers 110, 111, 113 have a negative TCF so that characteristic frequencies of the resonator such as resonance and anti-resonance frequencies drift to lower values with increasing temperature, layer 112 has a temperature compensating effect in that it has a positive TCF so that it counteracts the negative TCF of the other layers.

Layer 113 is a piezoelectric layer comprising or consisting of a suitable piezoelectric material such as lithium tantalate, lithium niobate, quartz, crystalline or columnar aluminum nitride, aluminum scandium nitride or others.

A pair of interdigitated electrodes are disposed on the top surface of piezoelectric layer 113. Each electrode comprises a multitude of, e.g. several hundreds of fingers wherein one finger of the first electrode is adjacent to another finger of the second electrode. In FIG. 1, representative electrodes 131 of the first electrode and electrode 132 of the second electrode are disposed at a pitch distance 133. The repetitive pitch 133 is related to the operating frequency of the SAW resonator. Usually twice the pitch equals the wavelength λ of the operating frequency.

Another dielectric, temperature compensating layer 122 is disposed on the top surface of the piezoelectric layer 113 and on top of the interdigitated electrodes. Temperature compensating layer 122 has a positive TCF and a low acoustic velocity. The positive TCF further compensates the negative TCF of the layers 110, 111, 113 and adds to the temperature compensating effect of layer 112. There are several options to select the material of layer 122 concerning the acoustic velocity. The acoustic velocity of layer 122 should be at least lower than the acoustic velocity of carrier substrate 110. Layer 122 may have the lowest acoustic velocity when compared to layers 110, 111, 112, 113, that is an acoustic velocity lower than any layer of the layered substrate. In a practical embodiment, the layer 122 may have the same acoustic velocity and the same temperature coefficient of frequency as layer 112. Layer 122 may be made of the same material as the temperature compensating, low velocity layer 112 of the layered substrate. According to an embodiment, layer 112 may be selected from the same group of materials as layer 112 which is silicon dioxide, germanium dioxide, scandium yttrium fluoride, zirconium tungsten oxide, hafnium tungsten oxide, doped silicon dioxide. In a preferred embodiment, layers 122 and 112 are made of the same material such as silicon dioxide or doped silicon dioxide. On top of the layer stack, a thin layer 123 having a passivation function is disposed on the surface of the low velocity temperature compensating layer 122. Layer 123 may be made of silicon nitride or other layers having a passivation function.

Figure 2:
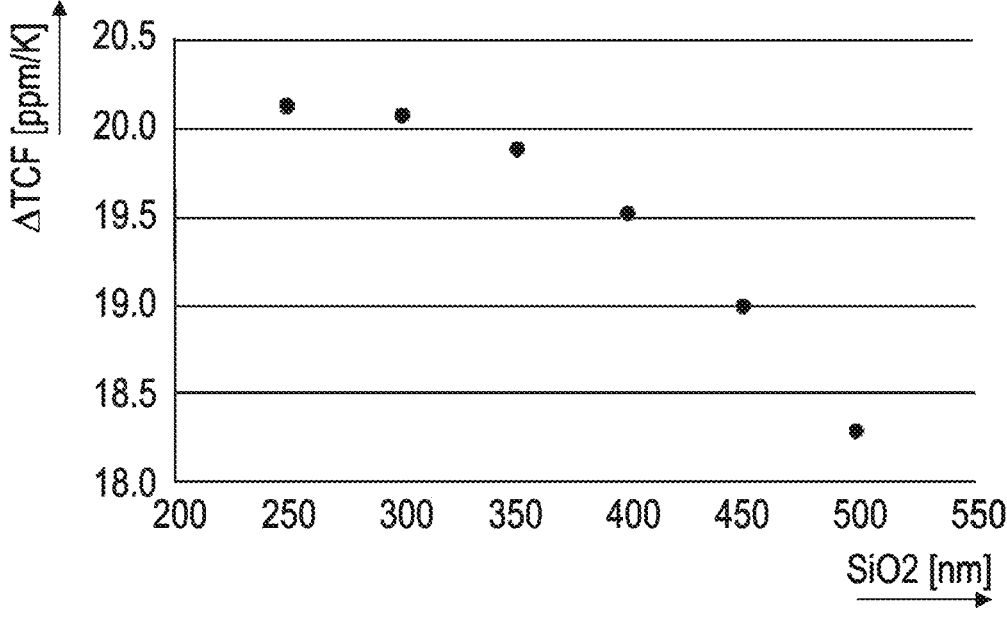
FIG. 2 shows the effect of increasing thickness of a top temperature compensating silicon dioxide layer on the difference of TCF between resonance and anti-resonance frequencies of a temperature compensated SAW resonator.

FIG. 2 shows a diagram obtained by simulation that illustrates the effect of the height of the layer 122 on the difference of TCF of resonance and anti-resonance frequencies, the so-called pole-zero-distance of the resonator of FIG. 1. As the pole-zero-distance of a resonator determines the bandwidth of a filter, the lower and upper edges of the passband of a filter will have a corresponding relation of the TCF. The horizontal axis of the chart in FIG. 2 shows the thickness of the silicon dioxide layer 122 in nanometers, the vertical axis shows the difference in TCF of the resonance and anti-resonance frequencies of the resonator in ppm/K. As can be gathered from FIG. 2, an increasing thickness of the silicon dioxide layer 122 reduces the difference in TCF for the resonance and anti-resonance frequencies of the resonator. Consequently, increasing thickness of layer 122 reduces also the difference in TCF of the lower and upper edges of the passband of a filter such as a ladder-type filter.

With the presence of temperature compensating layer 122, it is possible to reduce the height or thickness of temperature compensating layer 112 of the layered substrate. It turned out that a certain height of the top temperature compensating layer 122 has the same effect as a corresponding larger height of layer 112. The temperature compensating efficiency of layer 122 is higher than the temperature compensating efficiency of layer 112. One possible explanation for this observation could be that layer 122 carries more acoustic energy than layer 112 since layer 122 is closer to the interface between electrodes and piezoelectric layer, where the acoustic waves are originally generated, than layer 112. Consequently, with layer 122 disposed on top of the SAW resonator, the height of layer 112 can be reduced without sacrificing temperature compensating efficiency within the layered substrate system. As an additional effect, the excitation of volume waves in layer 112 which is directly related to the height of layer 112 is reduced. On the other hand, when comparing the temperature compensating effect of layers 112, 122, the same overall TCF of the resonator can be achieved by increasing the height of layer 122 and decreasing the height of layer 112, wherein a smaller increase of layer 122 allows a larger decrease of layer 112 assuming the same overall TCF of the resonator so that the use of layer 122 leads to a smaller overall height of the SAW resonator device when compared to a resonator having the same TCF without top temperature compensating layer 122.

Considering the height hd of temperature compensating layer 122 relative to the height hpiezo of the piezoelectric layer 113, it is useful to select the height hd of the temperature compensating layer 122 below 50% of the height hpiezo of piezoelectric layer 113. More preferably, a difference between the height hd of layer 122 and the height hpiezo of the piezoelectric layer 113 relative to the wavelength should be between 5% and 15% of the height of the piezoelectric layer 113, more preferably between 7% and 12%. A preferred effect of layer 122 is achieved when the height of layer 122 is about 10% or 10% of the height of the piezoelectric layer 113. The relation of heights between hd and hpiezo can be summarized as follows:

$$1\% < hd/\lambda - h\text{piezo}/\lambda < 50\% \text{ or}$$

$$5\% < hd/\lambda - h\text{piezo}/2 < 15\% \text{ or}$$

$$7\% < hd/\lambda - h\text{piezo}/\lambda < 12\% \text{ or}$$

$$hd/\lambda - h\text{piezo}/2 = 10\%.$$

Figure 3:
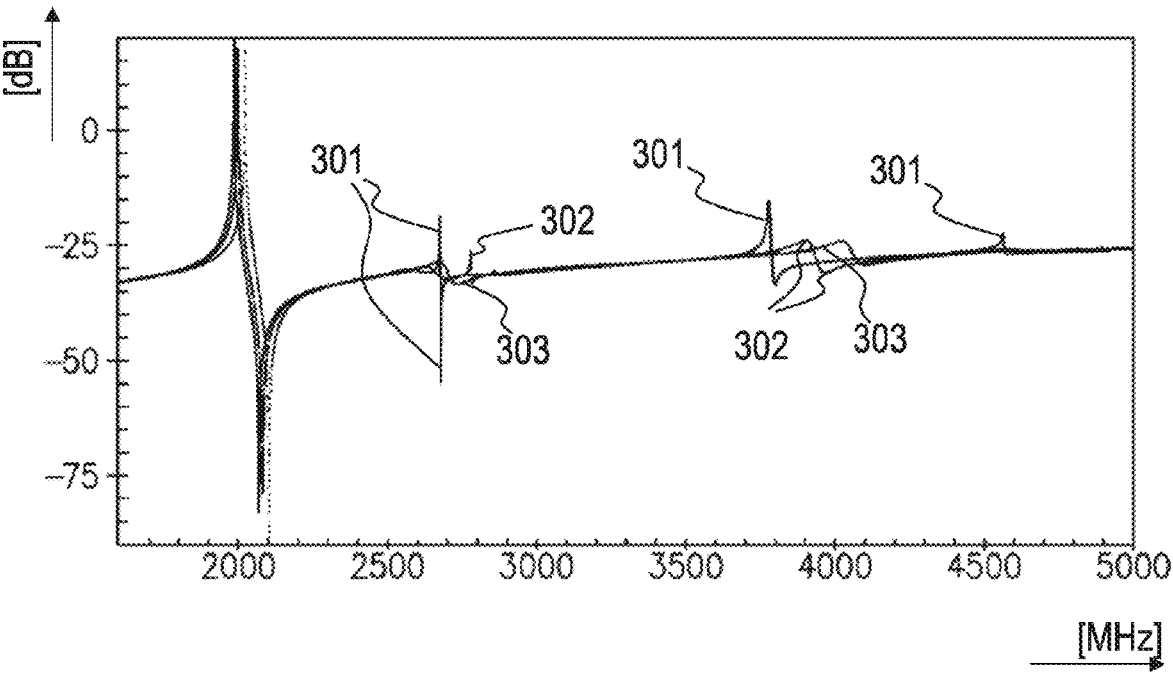
FIG. 3 shows an admittance chart for different heights of silicon dioxide layers used in the layered substrate and on top of the resonator.

FIG. 3 shows the effect of different thickness relations between layers 122 and 112 on the admittance function of the resonator. The large spikes 301 relate to a SAW resonator of reference that includes no top temperature compensating layer and comprises a temperature compensating layer 112 only of a thickness of 500 nm. The spikes in the admittance chart above the main mode are rather strong and are caused by unwanted volume modes propagating in the temperature compensating layer 112. The moderate spikes 302 relate to a SAW resonator having a temperature compensating layer 112 of 300 nm and a top temperature compensating layer of 150 nm. The relatively small spikes 303 relate to a SAW resonator having a temperature compensating layer 112 of 100 nm and a top temperature compensating layer 122 of 200 nm. As can be gathered from FIG. 3, even a reduction in the combined thicknesses of bottom and top temperature compensating layers achieves the same overall TCF for the resonator and a remarkable reduction of the volume mode excitation. The examples shown in FIG. 3 can be summarized as follows:

|  | Example 1 | Example 2 | Example 3 |
|---|---|---|---|
| Bottom layer 112 | 500 nm | 300 nm | 100 nm |
| Top layer 122 | 0 nm | 150 nm | 200 nm |
| Observation | large spikes 301 | moderate spikes 302 | small spikes 303 |

Figure 4:
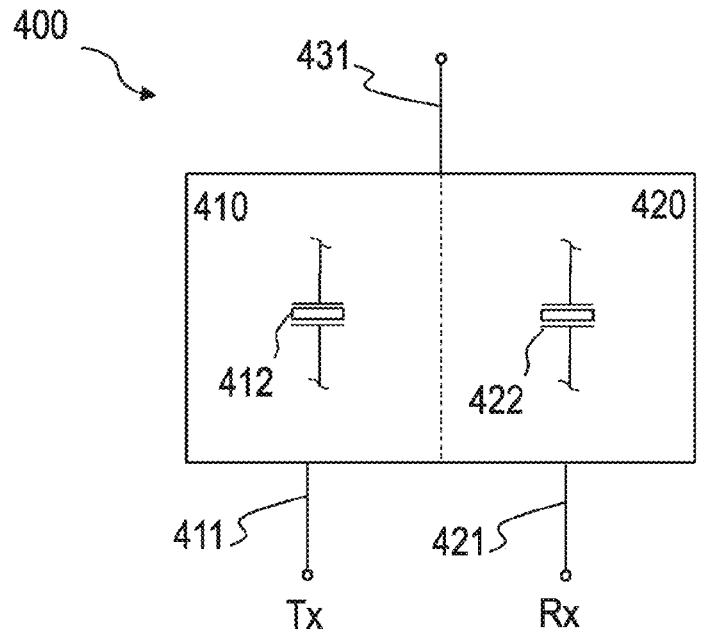
FIG. 4 shows a principle block diagram of a duplexer using resonators according to FIG. 1.

A SAW resonator is useful to form filters to be used in multiplexers. A multiplexer combines multiple ports through corresponding filters to one antenna port. A first order multiplexer is also called a duplexer. FIG. 4 depicts a duplexer 400 comprising an antenna poll 431 to which the antenna is to be coupled, a transmit (Tx) port 411 and a receive (Rx) port 421. Each signal path between antenna port 431 and transmit and receive ports 411, 421 includes a corresponding RF filter 410 and 420, respectively. Each of the filters 410, 420 is based on resonators such as 412, 422 which may be connected in a ladder-type structure or in any other suitable filter topology. Since unwanted modes from one of the filters of the duplexer such as a transmit filter 410 may couple into the receive filter 420, since the filters share the same antenna port 431, it is mandatory that any volume modes in a resonator having a layered substrate are as small as possible. When the resonators 412, 422 of filters 410, 420 include a top temperature compensating layer such as layer 422 of FIG. 1, the filters are substantially temperature compensated so that the lower and upper edges are substantially constant with regard to changing temperature. Temperature compensated edges of the passband avoid a different amount of drift of lower and upper passband edges which is the problem with temperature uncompensated layered substrate-based SAW resonators. Furthermore, the volume modes are fairly low so that cross-coupling between Tx and Rx bands is substantially reduced.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the aft, the disclosure should be construed to include everything within the scope of the appended claims.

The invention claimed is:

1. A surface acoustic wave resonator, comprising:
a layered substrate, comprising:
a carrier substrate having an acoustic velocity;
a first dielectric layer having an acoustic velocity lower than the acoustic velocity of the carrier substrate, the first dielectric layer disposed on the carrier substrate;
a piezoelectric layer disposed on the first dielectric layer;
interdigitated electrodes disposed on the piezoelectric layer; and
a second dielectric layer having an acoustic velocity lower than the acoustic velocity of the carrier substrate and having a positive temperature coefficient of frequency, the second dielectric layer disposed on the piezoelectric layer and on the interdigitated electrodes,
wherein the interdigitated electrodes comprise a plurality of fingers having a pitch related to a wavelength, and
wherein a height of the second dielectric layer is between 5% and 15% of a height of the piezoelectric layer.

2. The surface acoustic wave resonator of claim 1, wherein the second dielectric layer has an acoustic velocity lower than the acoustic velocity of any other layer of the layered substrate.

3. The surface acoustic wave resonator of claim 1, wherein the carrier substrate and the piezoelectric layer have a temperature coefficient of frequency below zero and the first dielectric layer and the second dielectric layer have a temperature coefficient of frequency larger than zero.

4. The surface acoustic wave resonator of claim 1, wherein the first dielectric layer and the second dielectric layer have a same temperature coefficient of frequency larger than zero.

5. The surface acoustic wave resonator of claim 1, wherein the second dielectric layer comprises silicon dioxide.

6. The surface acoustic wave resonator of claim 1, wherein the second dielectric layer comprises at least one of germanium dioxide, scandium yttrium fluoride, zirconium tungsten oxide, hafnium tungsten oxide.

7. The surface acoustic wave resonator of claim 1, the layered substrate further comprising a layer having an acoustic velocity higher than the acoustic velocity of the carrier substrate, said layer disposed between the carrier substrate and the first dielectric layer of the layered substrate.

8. The surface acoustic wave resonator of claim 1, further comprising a passivation layer disposed on the second dielectric layer.

9. The surface acoustic wave resonator of claim 1, wherein the carrier substrate comprises one of monocrystalline silicon, aluminum oxide, silicon carbide and diamond, wherein the first dielectric layer of the layered substrate comprises one of silicon dioxide, germanium dioxide and doped silicon dioxide and wherein the piezoelectric layer comprises one of lithium tantalate, lithium niobate, aluminum nitride and quartz.

10. The surface acoustic wave resonator of claim 9, the layered substrate further comprising a layer having an acoustic velocity higher than the acoustic velocity of the carrier substrate, said layer comprising one of polycrystalline silicon, amorphous silicon, aluminium nitride and silicon carbide.

11. A RF multiplexer circuit, comprising:

a first port to be coupled to an antenna;

a second port to be coupled to a transmit circuit and a transmit filter circuit coupled between the first and second ports; and a third port to be coupled to a receive circuit and a receive filter circuit coupled between the first and third ports, wherein transmit and receive filter circuits each include resonators, and wherein a first resonator of the resonators comprises:

a layered substrate, comprising:

a carrier substrate having an acoustic velocity;

a first dielectric layer having an acoustic velocity lower than the acoustic velocity of the carrier substrate, the first dielectric layer disposed on the carrier substrate;

a piezoelectric layer disposed on the first dielectric layer;

interdigitated electrodes disposed on the piezoelectric layer; and a second dielectric layer having an acoustic velocity lower than the acoustic velocity of the carrier substrate and having a positive temperature coefficient of frequency, wherein the interdigitated electrodes comprise a plurality of fingers having a pitch related to a wavelength, and wherein a height of the second dielectric layer is between 5% and 15% of a height of the piezoelectric layer.

12. The RF multiplexer circuit of claim 11, wherein the second dielectric layer has an acoustic velocity lower than the acoustic velocity of any other layer of the layered substrate.

13. The RF multiplexer circuit of claim 11, wherein the carrier substrate and the piezoelectric layer have a temperature coefficient of frequency below zero and the first dielectric layer and the second dielectric layer have a temperature coefficient of frequency larger than zero.

14. The RF multiplexer circuit of claim 11, wherein the first dielectric layer and the second dielectric layer have a same temperature coefficient of frequency larger than zero.

15. The RF multiplexer circuit of claim 11, wherein the second dielectric layer comprises silicon dioxide.

16. The surface acoustic wave resonator-RF multiplexer circuit of claim 11, wherein the second dielectric layer comprises at least one of germanium dioxide, scandium yttrium fluoride, zirconium tungsten oxide, hafnium tungsten oxide.

17. The surface acoustic wave resonator of RF multiplexer circuit claim 11, the layered substrate further comprising a layer having an acoustic velocity higher than the acoustic velocity of the carrier substrate, said layer disposed between the carrier substrate and the first dielectric layer of the layered substrate.

\*   \*   \*   \*   \*